(12) United States Patent
Roth et al.

(10) Patent No.: US 7,554,129 B2
(45) Date of Patent: Jun. 30, 2009

(54) LIGHT EMITTING DEVICE

(75) Inventors: Gundula Roth, Dorfstrasse (DE);
Walter Tews, Rudolf-Petershagen-Allee (DE); Chung Hoon Lee, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 11/024,702

(22) Filed: Dec. 30, 2004

(65) Prior Publication Data

US 2005/0274972 A1     Dec. 15, 2005

(30) Foreign Application Priority Data

Jun. 10, 2004     (KR)     ............... 10-2004-0042396

(51) Int. Cl.
*H01L 27/15*     (2006.01)
*H01L 29/24*     (2006.01)

(52) U.S. Cl. .................. 257/103; 257/79; 313/502; 313/503; 252/301.4 R; 252/301.4 F; 252/301.6 R

(58) Field of Classification Search ............ 257/81, 257/88, 98–100, E33.058, 79, 103; 313/498–500, 313/502, 503; 438/22, 24; 252/301.4 R, 252/301.4 P, 301.6 R
See application file for complete search history.

(56) References Cited

U.S. PATENT DOCUMENTS

| | | | |
|---|---|---|---|
| 2,617,773 A | 11/1952 | Nagy et al. | |
| 2,719,128 A | 9/1955 | Kressin et al. | |
| 2,780,600 A | 2/1957 | Wollentin | |
| 3,143,510 A | 8/1964 | Wanmaker et al. | |
| 3,644,212 A | 2/1972 | McAllister et al. | |
| 3,893,939 A | 7/1975 | De Kalb et al. | |
| 3,905,911 A | 9/1975 | Kelsey, Jr. et al. | |
| 4,215,289 A | 7/1980 | De-Hair et al. | |
| 4,770,950 A | 9/1988 | Ohnishi | |

(Continued)

FOREIGN PATENT DOCUMENTS

AT     410266     3/2003

(Continued)

OTHER PUBLICATIONS

W.L. Wanmaker, et al. "Luminescence of Phosphors Based on the Host Lattice ABGe206 (A, B=Ca, Sr, Ba)" Journeal of Solid State Chemistry 3, (1971), pp. 194-196.

(Continued)

*Primary Examiner*—Kenneth A Parker
*Assistant Examiner*—Joseph Nguyen
(74) *Attorney, Agent, or Firm*—HC Park & Associates, PLC

(57)     ABSTRACT

A light emitting device can include a substrate, electrodes provided on the substrate, a light emitting diode configured to emit light, the light emitting diode being provided on one of the electrodes, phosphors configured to change a wavelength of the light, and an electrically conductive device configured to connect the light emitting diode with another of the plurality of electrodes. The phosphors can substantially cove at least a portion of the light emitting diode. The phosphor may include aluminate type compounds, lead and/or copper doped silicates, lead and/or copper doped antimonates, lead and/or copper doped germanates, lead and/or copper doped germanate-silicates, lead and/or copper doped phosphates, or any combination thereof.

18 Claims, 4 Drawing Sheets

U.S. PATENT DOCUMENTS

| | | | |
|---|---|---|---|
| 4,972,086 | A | 11/1990 | Bryan et al. |
| 5,032,316 | A | 7/1991 | Takahashi et al. |
| 5,472,636 | A | 12/1995 | Forster et al. |
| 5,518,808 | A | 5/1996 | Bruno et al. |
| 5,770,110 | A | 6/1998 | Schrell et al. |
| 5,770,111 | A | 6/1998 | Moriyama et al. |
| 5,952,681 | A | 9/1999 | Chen |
| 5,965,192 | A | 10/1999 | Potter |
| 5,998,925 | A | 12/1999 | Shimizu |
| 6,045,722 | A | 4/2000 | Leblans et al. |
| 6,066,861 | A | 5/2000 | Hohn et al. |
| 6,373,184 | B1 | 4/2002 | Suh et al. |
| 6,472,765 | B1 | 10/2002 | Sano et al. |
| 6,482,664 | B1 | 11/2002 | Lee |
| 6,565,771 | B1 | 5/2003 | Ono et al. |
| 6,670,751 | B2 | 12/2003 | Song et al. |
| 6,686,691 | B1 | 2/2004 | Mueller |
| 6,842,664 | B2 | 1/2005 | Harada |
| 6,982,045 | B2 | 1/2006 | Menkara et al. |
| 6,982,048 | B1 | 1/2006 | Menkara et al. |
| 6,987,353 | B2 | 1/2006 | Menkara et al. |
| 7,019,335 | B2 * | 3/2006 | Suenaga ............ 257/99 |
| 7,029,602 | B2 | 4/2006 | Oshio |
| 7,045,078 | B2 | 5/2006 | Choi |
| 7,189,340 | B2 | 3/2007 | Shimomura et al. |
| 7,229,571 | B2 | 6/2007 | Ezuhara et al. |
| 2003/0168636 | A1 | 9/2003 | Dobson |
| 2004/0051111 | A1 * | 3/2004 | Ota et al. ............ 257/98 |
| 2005/0117334 | A1 | 6/2005 | Lee |
| 2005/0139846 | A1 * | 6/2005 | Park et al. .......... 257/98 |
| 2005/0239227 | A1 * | 10/2005 | Aanegola et al. .... 438/26 |
| 2005/0274930 | A1 | 12/2005 | Roth et al. |
| 2006/0261350 | A1 | 11/2006 | Kawazoe et al. |
| 2006/0267042 | A1 | 11/2006 | Izuno et al. |
| 2007/0029526 | A1 | 2/2007 | Cheng et al. |
| 2007/0284563 | A1 | 12/2007 | Lee et al. |
| 2008/0067472 | A1 | 3/2008 | Roth et al. |
| 2009/0050849 | A1 | 2/2009 | Lee et al. |

FOREIGN PATENT DOCUMENTS

| | | |
|---|---|---|
| CN | 1218084 | 6/1999 |
| CN | 1289454 | 3/2001 |
| CN | 1317537 | 10/2001 |
| CN | 1344777 | 4/2002 |
| CN | 1434521 | 8/2003 |
| DE | WO9812757 | 3/1998 |
| DE | 10233050 | 2/2004 |
| DE | 10259946 | 7/2004 |
| EP | 0382295 | 8/1993 |
| EP | 0862794 | 9/1998 |
| EP | 1249873 | 10/2002 |
| EP | 1605030 | 12/2005 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55135190 | 10/1980 |
| JP | 57109886 | 7/1982 |
| JP | 61258892 | 11/1986 |
| JP | 62-197487 | 9/1987 |
| JP | 5-78659 | 3/1993 |
| JP | 9-40946 | 2/1997 |
| JP | 9153644 | 6/1997 |
| JP | WO9805078 | 2/1998 |
| JP | 2001-115157 | 4/2001 |
| JP | 2001-308393 | 11/2001 |
| JP | 2002094122 | 3/2002 |
| JP | 2002-97466 | 4/2002 |
| JP | 2002173677 | 6/2002 |
| JP | 2002335019 | 11/2002 |
| JP | 2002359403 | 12/2002 |
| JP | 2002368277 | 12/2002 |
| JP | 2003-152229 | 5/2003 |
| JP | 2003183649 | 7/2003 |
| JP | 2003224306 | 8/2003 |
| JP | 2003321675 | 11/2003 |
| JP | 20046582 | 1/2004 |
| JP | 2004010786 | 1/2004 |
| JP | 2004071726 | 3/2004 |
| JP | 2004127988 | 4/2004 |
| JP | 2004192833 | 7/2004 |
| JP | 2005167177 | 6/2005 |
| KR | 10-232395 | 12/1999 |
| KR | 1020010032450 | 4/2001 |
| KR | 2001-50839 | 6/2001 |
| KR | 1020010101910 | 11/2001 |
| KR | 2002-835 | 1/2002 |
| KR | 2002-0053975 | 7/2002 |
| KR | 1020020079513 | 10/2002 |
| KR | 10-0392363 | 7/2003 |
| KR | 1020030063211 | 7/2003 |
| KR | 2003-82395 | 10/2003 |
| KR | 10-426034 | 7/2004 |
| KR | 1020040088418 | 10/2004 |
| KR | 1020050008426 | 1/2005 |
| KR | 1020050070349 | 7/2005 |
| KR | 2005-98462 | 10/2005 |
| KR | 10-2005-0108816 | 11/2005 |
| KR | 1020050106945 | 11/2005 |
| KR | 10-2005-0117165 | 12/2005 |
| KR | 1020050117164 | 12/2005 |
| KR | 10-0626272 | 9/2006 |
| KR | 10-2006-0134728 | 12/2006 |
| KR | 10-2007-0050833 | 5/2007 |
| KR | 10-2007-0064275 | 6/2007 |
| KR | 10-2007-0084659 | 8/2007 |
| KR | 10-2007-0086483 | 8/2007 |
| KR | 10-2007-0098194 | 10/2007 |
| KR | 10-2008-0074241 | 7/2008 |
| KR | 10-2008-0075181 | 7/2008 |
| WO | WO96/32457 | 10/1996 |
| WO | WO9632457 | 10/1996 |
| WO | 9839805 | 9/1998 |
| WO | 9842798 | 10/1998 |
| WO | 0019546 | 4/2000 |
| WO | 0141215 | 6/2001 |
| WO | 2002-054502 | 7/2002 |
| WO | 2002-054503 | 7/2002 |
| WO | 03021691 | 3/2003 |
| WO | 2004085570 | 10/2004 |
| WO | 2004111156 | 12/2004 |
| WO | 2005109532 | 11/2005 |
| WO | 2005112137 | 11/2005 |
| WO | 2006-043682 | 4/2006 |
| WO | 2006068359 | 6/2006 |
| WO | 2007-055538 | 5/2007 |
| WO | 2007055538 | 5/2007 |
| WO | 2007-069869 | 6/2007 |
| WO | 2007069869 | 6/2007 |
| WO | 2007114614 | 11/2007 |
| WO | 2009028818 | 3/2009 |

OTHER PUBLICATIONS

X. W. Sun, et al. "Pulsed Laser Deposition of Silicate Phosphor Thin Films", Appl. Phys. A 69, 1999, 5 pages.

Takashi Hase, et al., "Phosphor Handbook", CRC Press, 3 pages.

Shenstone, A.G., "The Third Spectrum of Copper (Cu III)", Journal of Research of the National Bureau of Standards - A. Physics and Chemistry, vol. 79A, No. 3, May-Jun. 1975, pp. 497-521.

Lever, A.B.P., "Inorganic Electronics Spectroscopy", 2nd ed., Elsevier, 1984, pp. 355 and 557-559.

Dubicki, Lujcan et al., "The First d-d Fluorescence of a Six-Coordinate Copper (II) Ion", J. Am. Chem. Soc., 1989, No. 111, pp. 3452-3454.

Scacco, A., et al., "Optical Spectra of Cu2+ Ions in LiF Crystals", Radiation Effects and Defects in Solids, vol. 134, 1995, pp. 333-336.

Shionoya, S., et al. (Eds.), "Principal phosphor materials and their optical properties" in Phosphor Handbook CRC Press, 1999, pp. 231-255.

Yang, Ping et al., "Photoluminescence of Cu+-doped and Cu2+-doped ZnS nanocrystallites", Journal of Physics and Chemistry of Solids, No. 63, 2002, pp. 639-643.

Suyver, J.F., et al., "Luminescence of nanocrystalline ZnSe:Cu", Applied Physics Letters, vol. 79, No. 25, Dec. 17, 2001, pp. 4222-4224.

Bol, Ageeth A., et al., "Luminescence of nanocrystalline ZnS:Cu2+", Journal of Luminescence, No. 99, 2002, pp. 325-334.

Non-Final Office Action mailed May 23, 2007 for U.S. Appl. No. 11/024,722, filed Dec. 30, 2004, entitled "Luminescent Material", Examiner Carol M. Koslow.

Amendment and Declaration under 37 CFR 1.132 filed in response to the Non-Final Office Action mailed May 23, 2007 for U.S. Appl. No. 11/024,722, filed Dec. 30, 2004, entitled "Luminescent Material".

Shionoya, S., et al. (Eds.), "Principal phosphor materials and their optical properties" in Phosphor Handbook, CRC Press, 1999, p. 826.

Final Office Action dated Oct. 22, 2007 isued in U.S. Appl. No. 11/024,722 filed Dec. 30, 2004.

"Phosphors for Mercury Lamps" https:/www.lamptech.co.uk/Docuemnts/M14%20Phosphors.htm 2003 (2 pages).

Butler, "Flourescent Lamp Phosphors", The Pennsylvania State University Press, 1980, pp. 281-284.

Wanmaker, Luminescence of Copper-Activated Orthophosphates of the Type ABPO (A=Ca, Sr, or Ba and B=Li, Na or K, Journal of the Electrochemical Society, pp. 109-113.

Shinoya, "Phosphor Handbook", edited under the auspice of Phosphor Research Society, CRC Press, 1999, pp. 238-231.

van Gool, Philips Res. Rept. Suppl., 3, 1, 1961 (2 pages).

Wanmaker, "Luminescence of Copper-Activated Calcium and Strontium Orthophosphates", Journal of the Electromagnetic Society, pp. 1027-1031.

Shinonoya, "Phosphor Handbook", edited under the auspice of Phosphor Research Society, CRC Press, 1999, pp. 204-205.

Blasse, "Radiationless Processes in Luminescent Materials", Radiationless Processes, 1980, pp. 287-289, 283.

Butler, "Fluorescent Lamp Phosphors", The Pennsylvania State University Press, 1980, pp. 181-182.

Butler, "Fluorescent Lamp Phosphors", The Pennsylvania State University Press, 1980, pp. 175-176.

Bernhardt, Investigations of the Orange Luminescence of PbMo04 Crystals, Phys. Stat. Sol. (2), 91, 643, 1985, pp. 643-647.

Yang, Conversion Fluorescence in Er3 + Yb3 + Co- Doped Oxy - Fluoride Compound Materials' Based on GeO2, Natural Science Journal of Xiangtan University, vol. 23, No. 2, 2001, pp. 37-41.

First Office Action of the State Intellectual Property Office of the PRC corresponding to Chinese Patent Application No. 20051002304.2 dated Feb. 15, 2008.

Shinoya, "Phosphor Handbook", edited under the auspice of Phosphor Research Society, CRC Press, 1998, pp. 238-239, 241.

Shinoya, "Phosphor Handbook", edited under the auspice of Phosphor Research Society, CRC Press, 1998, pp. 204-205.

Blasse, "Radiatonless Processes in Luminescent Materials", Radiationless Processes, 1980, pp. 287-289, 293.

Wanmaker et al., "Luminescence of Copper-Activated Calcium and Strontium Orthophosphates", Journal of the Electrochemical Society, 1959, pp. 1027-1031.

van Gool, Philips Res. Rept. Suppl. 3, 1961, pp. 1-9, 30-51, 84, 85.

Full translation of Japanese Patent Publication No. S31-1118 dated Feb. 17, 1956.

Full translation of Japanese Patent Publication No. S33-8177 dated Sep. 15, 1958.

Full translation of Japanese Patent Publication No. S39-8803 dated May 28, 1964.

Full translation of Japanese Patent Publication No. S49-38994 dated Oct. 22, 1974.

Chen, R., "Developments in Luminescence and Display Materials Over the Last 100 Years as Reflected in Electrochemical Society Publications", Journal of Electrochemical Society, 149, pp. 69-78.

G. Blasse, B.C. Grabmeier, "Luminescent Materials", Springer, 1994, pp. 40-47.

G. Blasse and A. Bril, "Characteristic Luminescence", Philips Technical Review, 31 (1970) 304, p. 306.

G. Blasse and A. Bril, "Characteristic Luminescence", Philips Technical Review, 31 (1970) 304, p. 310.

S. Shionoya, W. M. Yen, "Phosphor Handbook" CRC press, 1999, ch. 3.3, pp. 179-182.

Garcia Solé, L.E. Bausá, "An Introduction to the Optical Spectroscopy of Inorganic Solids", Wiley, 2005, pp. 132-133.

S. Shionoya, W. M. Yen, "Phosphor Handbook" CRC press, 1999, ch. 3.3, pp. 183-184.

G. Blasse, B.C. Grabmeier, "Luminescent Materials", Springer, 1994, p. 25.

J. Garcia Solé, L.E. Bausá, D. Jaque, "An Introduction to the Optical Spectroscopy of Inorganic Solids", Wiley, 2005, pp. 163-164.

P.A. Cox, "Transition Metal Oxides", Oxford University Press, 1995, p. 105.

G.L. Miessler, D.A. Tarr, "Inorganic Chemistry", 3rd ed., Pearson / Prentice Hall, pp. 117-118.

R.J. Angel et al., "Structure and twinning of single-crystal MgSiO3 garnet synthesized at 17 GPa and 1800° C", American Mineralogist, 74 (1989) pp. 509-512.

B. Cordero, V. Gómez, A. E. Platero-Prats, M. Revés, J. Echeverria, E. Cremades, F. Barragán, and S. Alvarez "Covalent radii revisited", Dalton Trans., (2008), pp. 2832-2838.

G. Blasse, B.C. Grabmeier, "Luminescent Materials", Springer, 1994, 87-90.

Feldmann C., "Inorganic Luminescent Materials: 100 Years of Research and Application", Adv. Funct. Matter, 2003, pp. 511-516.

Blasse G., "Characteristic Luminescence", Philips Technical Review, vol. 31, 1970, pp. 304-332.

Declaration Under Rule 37 CFR 1.132 of Ulrich Kynast dated Sep. 6, 2008.

L. Ya. Markoviskiy, et al., "Phosphors", Publishing House "Khimiya", Moscow 1966, Leningrad.

N. S. Akhmetov, "Inorganic Chemistry", Moscow "Vysshaya shkola", 1975.

Ralchenko, Yu., Kramida, A.E., Reader, J. and NIST ASD Team (2008). NIST Atomic Spectra Database (version 3.1.5), [Online], Available: http://physics.nist.gov/asd3 [Feb. 27, 2009], National Institute of Standards and Technology, Gaithersburg, MD.

International Search Report dated Feb. 27, 2009 for PCT Application No. PCT/KR2008/004734.

H.G. Kang, et al., Embodient and Luminescence Properties of Sr3SiO5:Eu(yellow-orange phosphor) by co-doping Ianthanide, Solid State Phenomena, vol. 124-126 (2007) pp. 511-514.

G. Roth, et al. "Advanced Silicate Phosphors for improved white LED", Global Phosphor Summit Seoul/Korea, Mar. 5-7, 2007.

T.L. Barry, "Equilibria and Eu2+ luminescence of subsolidus phases bounded by Ba3MgSi2O8, Sr3MgSi2O8 and Ca3MgSi2O8," J. Electrochem. Soc., vol. 115 No. 7 (Jul. 1968), pp. 733-738.

G. Blasse, et al., "Fluorescence of Europium2+-activated silicates," Philips Res. Repts 23 (1968), pp. 189-199.

S.D. Jee, et al., "Photoluminescence properties of Eu2+-activated Sr3SiO5 Phosphors," J. Mater Sci. 41 (2006), pp. 3139-3141.

International Search Report dated Feb. 11, 2009 for PCT Application No. PCT/2008/004733.

Search Report dated Feb. 2, 2009 for EP Application No. EP08014684.

Joung Kyu Park, et al., "Luminescence Characteristics of Yellow Emitting Ba3SiO5:EU2+ Phosphor", Journal of Materials Science 40(2005), pp. 2069-2071, XP-002511068.

Joung Kyu Park, et al., "Silicate Phosphors for White LEDs Identified Through Combinatorial Chemistry", Electrochemical and Solid-State Letters, 10 (2), J15-J18, (2007), XP-002511067.

T.L. Barry, "Fluorescence of Eu2+ Activated Phases in Binary Alkaline Earth Orthosilicate Systems", J. Electrochem Soc., Nov. 1968, pp. 1181-1184.

International Search Report dated Aug. 12, 2005 for PCT Application No. PCT/2005/001287.

International Search Report dated Aug. 12, 2005 for PCT Application No. PCT/2005/001288.

International Search Report dated Oct. 13, 2005 for PCT Application No. PCT/2005/002333.

International Search Report dated Oct. 24, 2005 for PCT Application No. PCT/2005/002332.

International Search Report dated Feb. 20, 2007 for PCT Application No. PCT/2006/004716.

International Search Report dated Mar. 21, 2007 for PCT Application No. PCT/2006/005500.

International Search Report dated Jul. 12, 2007 for PCT Application No. PCT/2007/001587.

Search Report dated Apr. 11, 2006 for EP Application No. EP04106880.0.

Search Report dated Aug. 21, 2007 for EP Application No. EP04106882.6.

Search Report dated Nov. 5, 2008 for EP Application No. EP06812549.1.

Lee, Chung-Hoon, Unpublished U.S. Appl. No. 11/568,769; corresponds to WO 2005109532.

Roth, Gundula, Unpublished U.S. Appl. No. 12/093,441; corresponds to KR 10-2007-0050833 and WO 2007055538.

Roth, Gundula, Unpublished U.S. Appl. No. 12/097,741; corresponds to WO 2007069869 and KR 10-2007-0064275.

Roth, Gundula, Unpublished U.S. Appl. No. 12/295,438; corresponds to WO 2007114614 and KR 10-2007-0098194.

Lee, Chung-Hoon, Unpublished U.S. Appl. No. 12/440,001; corresponds to WO 2009028818 and KR 10-2007-0086483 and KR 10-2008-0075181.

* cited by examiner

LIGHT EMITTING DEVICE

This case is related to copending U.S. patent application Ser. No. 11/024,722, filed Dec. 30, 2004.

BACKGROUND OF THE INVENTION

1. Field of the Invention

The invention relates to light emitting devices and more particularly to light emitting devices including at least one light-emitting diode and phosphor, the phosphor including lead and/or copper doped chemical compounds and converting the wavelength of light.

2. Description of the Related Art

Light emitting devices (LEDs), which used to be used for electronic devices, are now used for automobiles and illumination products. Since light emitting devices have superior electrical and mechanical characteristics, demands for light emitting devices have been increased. In connection to this, interests in white LEDs are increasing as an alternative to fluorescent lamps and incandescent lamps.

In LED technology, solution for realization of white light is proposed variously. Normally, realization of white LED technology is to put the phosphor on the light-emitting diode, and mix the primary emission from the light emitting diode and the secondary emission from the phosphor, which converts the wavelength. For example, as shown in WO 98/05078 and WO 98/12757, use a blue light emitting diode, which is capable of emitting a peak wavelength at 450-490 nm, and YAG group material, which absorbs light from the blue light emitting diode and emits yellowish light (mostly), which may have different wavelength from that of the absorbed light.

However, in such a usual white LED, color temperature range is narrow which is between about 6,000-8,000K, and CRI (Color Rendering Index) is about 60 to 75. Therefore, it is hard to produce the white LED with color coordination and color temperature that are similar to those of the visible light. It is one of the reasons why only white light color with a cold feeling could be realized. Moreover, phosphors which are used for white LEDs are usually unstable in the water, vapor or polar solvent, and this unstableness may cause changes in the emitting characteristics of white LED.

SUMMARY OF THE INVENTION

Wavelength conversion light emitting device are provided. In one embodiment consistent with this invention, a device is provided for emitting light. The device can include a substrate, a plurality of electrodes provided on the substrate, a light emitting diode configured to emit light, the light emitting diode being provided on one of the plurality of electrodes, phosphors configured to change a wavelength of the light, the phosphors substantially covering at least a portion of the light emitting diode, and an electrically conductive device configured to connect the light emitting diode with another of the plurality of electrodes.

In another embodiment consistent with this invention, a light emitting device can include a plurality of leads, a diode holder provided at the end of one of the plurality of lead, a light emitting diode provided in the diode holder, the light emitting diode including a plurality of electrodes, phosphors configured to change a wavelength of the light, the phosphors substantially covering at least a portion of the light emitting diode; and an electrically conductive device configured to connect the light emitting device with another of the plurality of leads.

In another embodiment consistent with this invention, a light emitting device may include a housing, a heat sink at least partially provided in the housing, a plurality of lead frames provided on the heat sink, a light emitting diode mounted on one of the plurality of lead frames, phosphors configured to change a wavelength of the light, the phosphors substantially covering at least a portion of the light emitting diode, and an electrically conductive device configured to connect the light emitting diode with another of the plurality of lead frames.

The phosphor in consistent with this invention may include aluminate type compounds, lead and/or copper doped silicates, lead and/or copper doped antimonates, lead and/or copper doped germanates, lead and/or copper doped germanate-silicates, lead and/or copper doped phosphates, or any combination thereof. Formulas for phosphors consistent with this invention are also provided.

BRIEF DESCRIPTION OF THE DRAWINGS

Further aspects of the invention may be apparent upon consideration of the following detailed description, taken in conjunction with the accompanying drawings, in which like reference characters refer to like parts throughout, and in which.

DETAILED DESCRIPTION OF THE PREFERRED EMBODIMENT

Refer to the attached drawing, the wavelength conversion light emitting device is going to be explained in detail, and the light emitting device and the phosphor are separately explained for easiness of explanation as below.

(Light Emitting Device)

Figure 1:
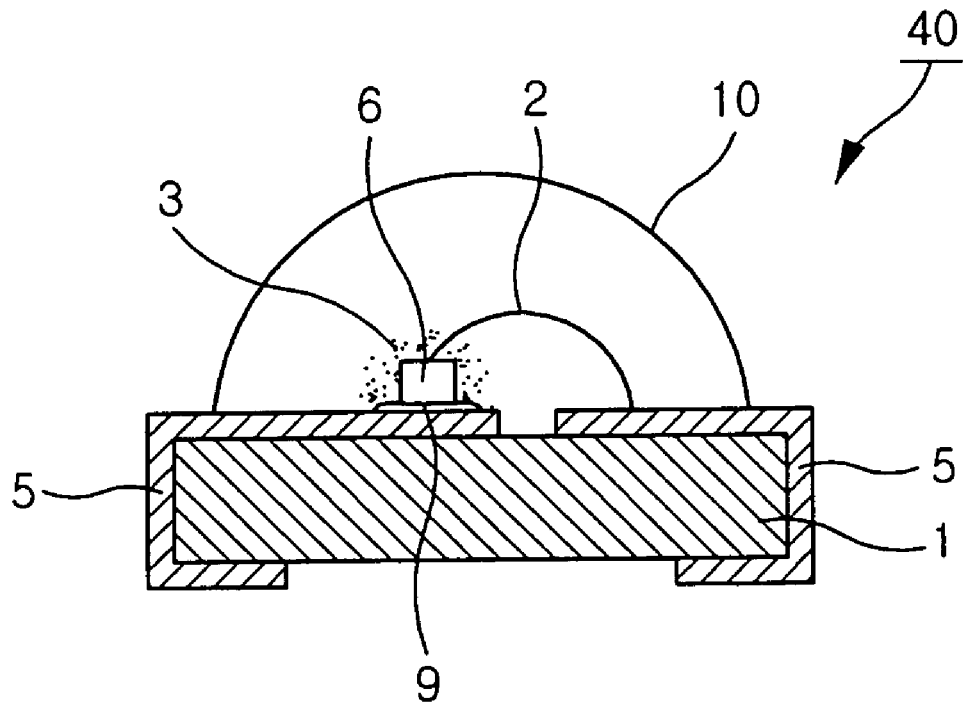
FIG. 1 shows a side cross-sectional view of an illustrative embodiment of a portion of a chip-type package light emitting device consistent with this invention.

FIG. 1 shows a side cross-sectional view of an illustrative embodiment of a portion of a chip-type package light emitting device consistent with this invention. The chip-type package light emitting device may comprise at least one light emitting diode and a phosphorescent substance. Electrodes 5 may be formed on both sides of substrate 1. Light emitting diode 6 emitting light may be mounted on one of the electrodes 5. Light emitting diode 6 may be mounted on electrode 5 through electrically conductive paste 9. An electrode of light emitting diode 6 may be connected to electrode pattern 5 via an electrically conductive wire 2.

Light emitting diodes may emit light with a wide range of wavelengths, for example, from ultraviolet light to visible light. In one embodiment consistent with this invention, a UV light emitting diode and/or blue light emitting diode may be use.

Phosphor, i.e., a phosphorescent substance, 3 may be placed on the top and side faces of the light emitting diode 6. The phosphor in consistent with this invention may include lead and/or copper doped aluminate type compounds, lead and/or copper doped silicates, lead and/or copper doped antimonates, lead and/or copper doped germanates, lead and/or copper doped germanate-silicates, lead and/or copper doped phosphates, or any combination thereof. Phosphor 3 converts the wavelength of the light from the light emitting diode 6 to another wavelength or other wavelengths. In one embodiment consistent with this invention, the light is in a visible light range after the conversion. Phosphor 3 may be applied to light emitting diode 6 after mixing phosphor 3 with a hardening resin. The hardening resin including phosphor 3 may also be applied to the bottom of light emitting diode 6 after mixing phosphor 3 with electrically conductive paste 9.

The light emitting diode 6 mounted on substrate 1 may be sealed with one or more sealing materials 10. Phosphor 3 may be placed on the top and side faces of light emitting diode 6. Phosphor 3 can also be distributed in the hardened sealing material during the production. Such a manufacturing method is described in U.S. Pat. No. 6,482,664, which is hereby incorporated by reference in its entirety.

Phosphor 3 may comprise lead and/or copper doped chemical compound(s). Phosphor 3 may include one or more single chemical compounds. The single compound may have an emission peak of, for example, from about 440 nm to about 500 nm, from about 500 nm to about 590 nm, or from about 580 nm to 700 nm. Phosphor 3 may include one or more single phosphors, which may have an emission peak as exemplified above.

In regard to light emitting device 40, light emitting diode 6 may emit primary light when light emitting diode 6 receives power from a power supply. The primary light then may stimulate phosphor(s) 3, and phosphor(s) 3 may convert the primary light to a light with longer wavelength(s) (a secondary light). The primary light from the light emitting diode 6 and the secondary light from the phosphors 3 are diffused and mixed together so that a predetermined color of light in visible spectrum may be emitted from light emitting diode 6. In one embodiment consistent with this invention, more than one light emitting diodes that have different emission peaks can be mounted together. Moreover, if the mixture ratio of phosphors is adjusted properly, specific color of light, color temperature, and CRI can be provided.

As described above, if the light emitting diode 6 and the compound included in phosphor 3 are properly controlled then desired color temperature or specific color coordination can be provided, especially, wide range of color temperature, for example, from about 2,000K to about 8,000K or about 10,000K and/or color rendering index of greater than about 90. Therefore, the light emitting devices consistent with this invention may be used for electronic devices such as home appliances, stereos, telecommunication devices, and for interior/exterior custom displays. The light emitting devices consistent with this invention may also be used for automobiles and illumination products because they provide similar color temperatures and CRI to those of the visible light.

Figure 2:
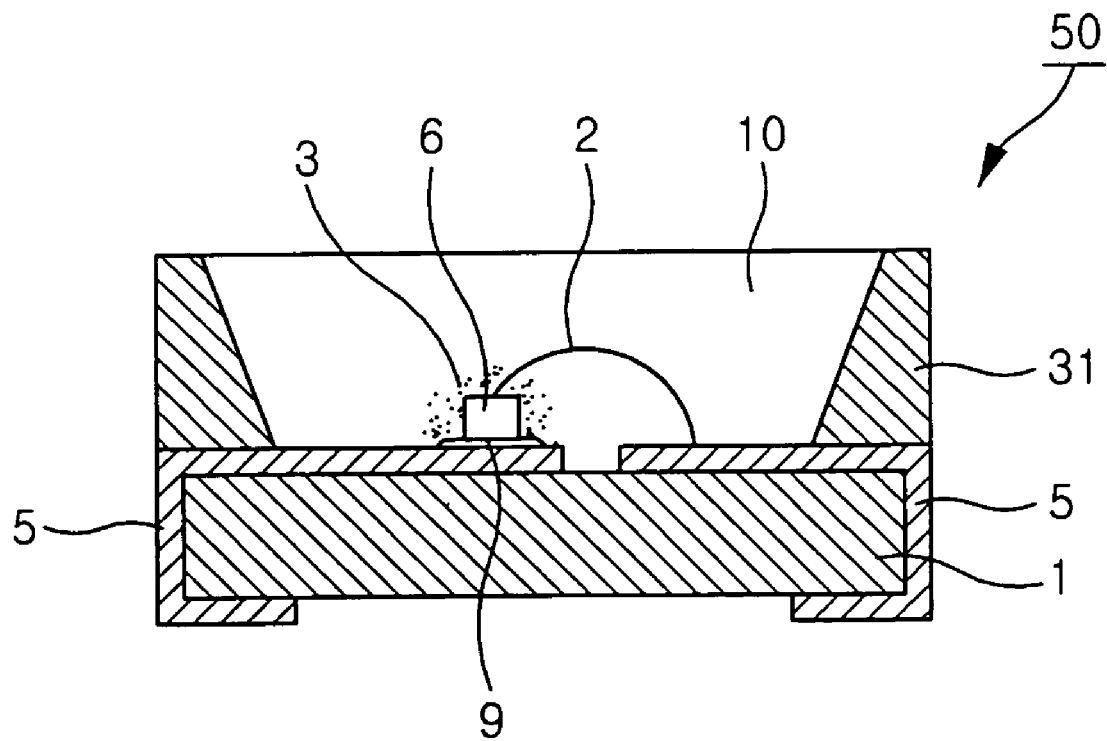
FIG. 2 shows a side cross-sectional view of an illustrative embodiment of a portion of a top-type package light emitting device consistent with this invention.

FIG. 2 shows a side cross-sectional view of an illustrative embodiment of a portion of a top-type package light emitting device consistent with this invention. A top-type package light emitting device consistent with this invention may have a similar structure as that of the chip type package light emitting device 40 of FIG. 1. The top-type package device may have reflector 31 which may reflect the light from the light emitting diode 6 to the desire direction.

In top-type package light emitting device 50, more than one light emitting diodes can be mounted. Each of such light emitting diodes may have a different peak wavelength from that of others. Phosphor 3 may comprise a plurality of single compounds with different emission peak. The proportion of each of such plurality of compounds may be regulated. Such a phosphor may be applied to the light emitting diode and/or uniformly distributed in the hardening material of the reflector 31. As explained more fully below, the phosphor in consistent with this invention may include lead and/or copper doped aluminate type compounds, lead and/or copper doped silicates, lead and/or copper doped antimonates, lead and/or copper doped germanates, lead and/or copper doped germanate-silicates, lead and/or copper doped phosphates, or any combination thereof.

In one embodiment consistent with this invention, the light emitting device of the FIG. 1 or FIG. 2 can include a metal substrate, which may have good heat conductivity. Such a light emitting device may easily dissipate the heat from the light emitting diode. Therefore, light emitting devices for high power may be manufactured. If a heat sink is provided beneath the metal substrate, the heat from the light emitting diode may be dissipated more effectively.

Figure 3:
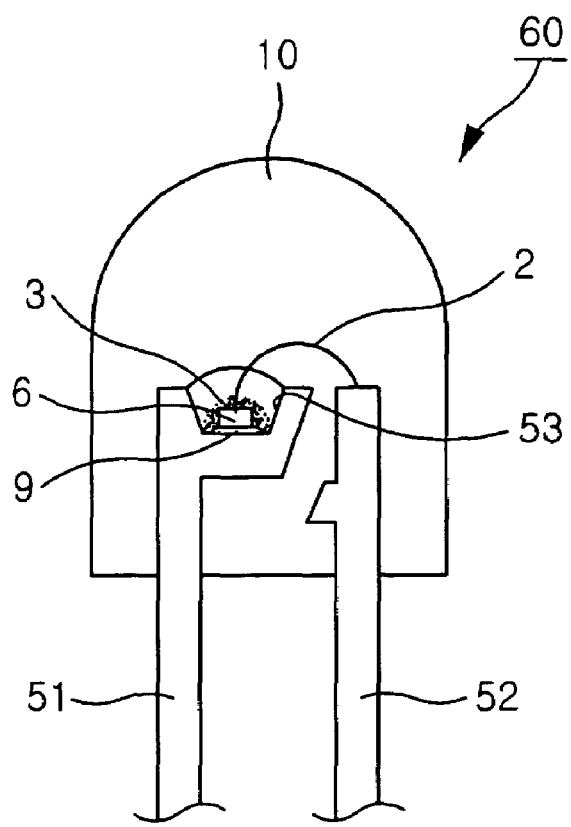
FIG. 3 shows a side cross-sectional view of an illustrative embodiment of a portion of a lamp-type package light emitting device consistent with this invention.

FIG. 3 shows a side cross-sectional view of an illustrative embodiment of a portion of a lamp-type package light emitting device consistent with this invention. Lamp type light emitting device 60 may have a pair of leads 51, 52, and a diode holder 53 may be formed at the end of one lead. Diode holder 53 may have a shape of cup, and one or more light emitting diodes 6 may provided in the diode holder 53. When a number of light emitting diodes are provided in the diode holder 53, each of them may have a different peak wavelength from that of others. An electrode of light emitting diode 6 may be connected to lead 52 by, for example, electrically conductive wire 2.

Regular volume of phosphor 3, which may be mixed in the epoxy resin, may be provided in diode holder 53. As explained more fully below, phosphor 3 may include lead and/or copper doped components.

Moreover, the diode holder may include the light emitting diode 6 and the phosphor 3 may be sealed with hardening material such as epoxy resin or silicon resin.

In one embodiment consistent with this invention, the lamp type package light emitting device may have more than one pair of electrode pair leads.

Figure 4:
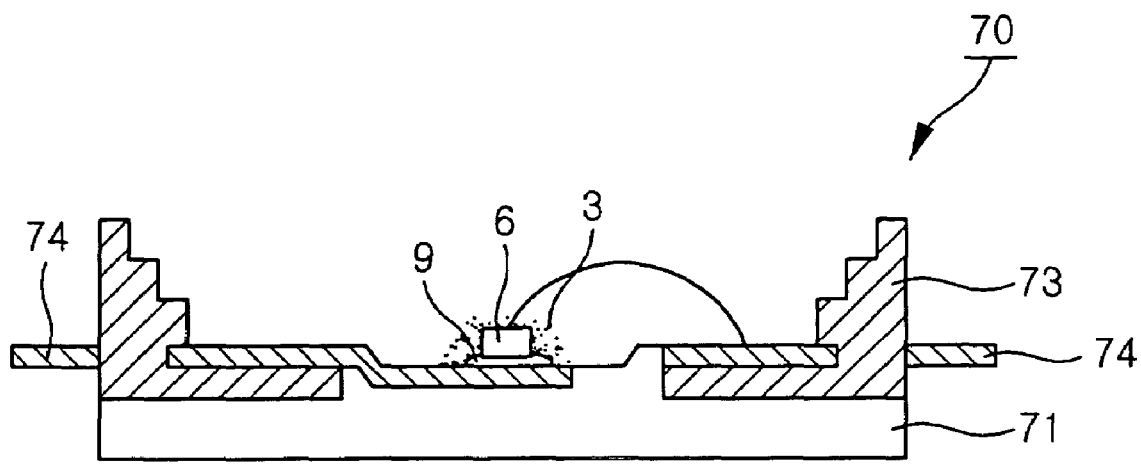
FIG. 4 shows a side cross-sectional view of an illustrative embodiment of a portion of a light emitting device for high power consistent with this invention.

FIG. 4 shows a side cross-sectional view of an illustrative embodiment of a portion of a light emitting device for high power consistent with this invention. Heat sink 71 may be provided inside of housing 73 of the light emitting device for high power 70, and it may be partially exposed to outside. A pair of lead frame 74 may protrude from housing 73.

One or more light emitting diodes may be mounted one lead frame 74, and an electrode of the light emitting diode 6 and another lead frame 74 may be connected via electrically conductive wire. Electrically conductive pate 9 may be provided between light emitting diode 6 and lead frame 74. The phosphor 3 may be placed on top and side faces of light emitting diode 6.

Figure 5:
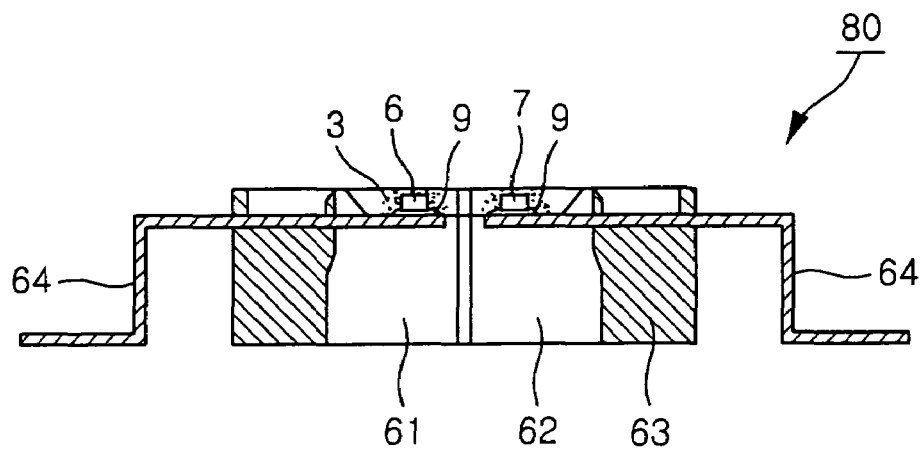
FIG. 5 shows a side cross-sectional view of another illustrative embodiment of a portion of a light emitting device for high power consistent with this invention.

FIG. 5 shows a side cross-sectional view of another illustrative embodiment of a portion of a light emitting device for high power consistent with this invention.

Light emitting device for high power 80 may have housing 63, which may contain light emitting diodes 6, 7, phosphor 3 arranged on the top and side faces of light emitting diodes 6, 7, one or more heat sinks 61, 62, and one or more lead frames 64. The lead frames 64 may receive power from a power supplier and may protrude from housing 63.

In the light emitting devices for high power 70, 80 in the FIGS. 4 and 5, the phosphor 3 can be added to the paste, which may be provided between heat sink and light emitting devices. A lens may be combined with housing 63, 73.

In a light emitting device for high power consistent with this invention, one or more light emitting diodes can be used selectively and the phosphor can be regulated depending on the light emitting diode. As explained more fully below, the phosphor may include lead and/or copper doped components.

A light emitting device for high power consistent with this invention may have a radiator (not shown) and/or heat sink(s). Air or a fan may be used to cool the radiator.

The light emitting devices consistent with this invention is not limited to the structures described above, and the structures can be modified depending on the characteristics of light emitting diodes, phosphor, wavelength of light, and also applications. Moreover, new part can be added to the structures.

An exemplary phosphor consistent with this invention is as follows.

(Phosphor)

Phosphor in consistence with this invention may include lead and/or copper doped chemical compounds. The phosphor may be excited by UV and/or visible light, for example, blue light. The compound may include Aluminate, Silicate, Antimonate, Germanate, Germanate-silicate, or Phosphate type compounds.

Aluminate type compounds may comprise compounds having formula (1), (2), and/or (5)

$$a(M'O).b(M''_2O).c(M''X).d(Al_2O_3).e(M'''O).f(M''''_2O_3).g(M''''''_nO_p).h(M''''''_xO_y) \quad (1)$$

wherein M' may be Pb, Cu, and/or any combination thereof; M'' may be one or more monovalent elements, for example, Li, Na, K, Rb, Cs, Au, Ag, and/or any combination thereof; M''' may be one or more divalent elements, for example, Be, Mg, Ca, Sr, Ba, Zn, Cd, Mn, and/or any combination thereof; M'''' may be one or more trivalent elements, for example, Sc, B, Ga, In, and/or any combination thereof; M''''' may be Si, Ge, Ti, Zr, Mn, V, Nb, Ta, W, Mo, and/or any combination thereof; M'''''' may be Bi, Sn, Sb, Sc, Y, La, Ce, Pr, Nd, Pm, Sm, Eu, Gd, Tb, Dy, Ho, Er, Tm, Yb, Lu, and/or any combination thereof; X may be F, Cl, Br, I, and/or any combination thereof; $0<a\leq2$; $0\leq b\leq2$; $0\leq c\leq2$; $0<d\leq8$; $0<e\leq4$; $0\leq f\leq3$; $0\leq g\leq8$; $0<h\leq2$; $1\leq o\leq2$; $1\leq p\leq5$; $1\leq x\leq2$; and $1\leq y\leq5$.

$$a(M'O).b(M''_2O).c(M''X).4-a-b-c(M'''O).7(Al_2O_3).d(B_2O_3).e(Ga_2O_3).f(SiO_2).g(GeO_2).h(M''''_xO_y) \quad (2)$$

wherein M' may be Pb, Cu, and/or any combination thereof; M'' may be one or more monovalent elements, for example, Li, Na, K, Rb, Cs, Au, Ag, and/or any combination thereof; M''' may be one or more divalent elements, for example, Be, Mg, Ca, Sr, Ba, Zn, Cd, Mn, and/or any combination thereof; M'''' may be Bi, Sn, Sb, Sc, Y. La, In, Ce, Pr, Nd, Pm, Sm, Eu, Gd, Tb, Dy, Ho, Er, Tm, Yb, Lu, and any combination thereof; X may be F, Cl, Br, I, and any combination thereof; $0<a\leq4$; $0\leq b\leq2$; $0\leq c\leq2$; $0\leq d\leq1$; $0\leq e\leq1$; $0\leq f\leq1$; $0\leq g\leq1$; $0<h\leq2$; $1\leq x\leq2$; and $1\leq y\leq5$.

The preparation of copper as well as lead doped luminescent materials may be a basic solid state reaction. Pure starting materials without any impurities, e.g. iron, may be used. Any starting material which may transfer into oxides via a heating process may be used to form oxygen dominated phosphors.

EXAMPLES OF PREPARATION

Preparation of the Luminescent Material Having Formula (3)

$$Cu_{0.02}Sr_{3.98}Al_{14}O_{25}:Eu \quad (3)$$

Starting materials: CuO, SrCO_3, Al(OH)_3, Eu_2O_3, and/or any combination thereof.

As shown above, it will be appreciated that, in formula (3), the composition $Cu_{0.02}SR_{3.98}Al_{14}Q_{25}$ represents the host material of the luminescent material and Eu represents the activator of the luminescent material. The starting materials in the form of oxides, hydroxides, and/or carbonates may be mixed in stoichiometric proportions together with small amounts of flux, e.g., H_3BO_3. The mixture may be fired in an alumina crucible in a first step at about 1,200° C. for about one hour. After milling the pre-fired materials a second firing step at about 1,450° C. in a reduced atmosphere for about 4 hours may be followed. After that the material may be milled, washed, dried and sieved. The resulting luminescent material may have an emission maximum of about 494 nm.

TABLE 1 copper doped $Eu^{2+}$-activated aluminate compared with $Eu^{2+}$-activated aluminate without copper at about 400 nm excitation wavelength

|  | Copper doped compound $Cu_{0.02}Sr_{3.98}Al_{14}O_{25}:Eu$ | Compound without copper $Sr_4Al_{14}O_{25}:Eu$ |
|---|---|---|
| Luminous density (%) | 103.1 | 100 |
| Wavelength (nm) | 494 | 493 |

Preparation of the Luminescent Material Having Formula (4)

$$Pb_{0.05}Sr_{3.95}Al_{14}O_{25}:Eu \quad (4)$$

Starting materials: PbO, SrCO_3, Al_2O_3, Eu_2O_3, and/or any combination thereof.

The starting materials in form of very pure oxides, carbonates, or other components which may decompose thermically into oxides, may be mixed in stoichiometric proportion together with small amounts of flux, for example, H_3BO_3. The mixture may be fired in an alumina crucible at about 1,200° C. for about one hour in the air. After milling the pre-fired materials a second firing step at about 1,450° C. in air for about 2 hours and in a reduced atmosphere for about 2 hours may be followed. Then the material may be milled, washed, dried, and sieved. The resulting luminescent material may have an emission maximum of from about 494.5 nm.

TABLE 2 lead doped $Eu^{2+}$-activated aluminate compared with $Eu^{2+}$-activated aluminate without lead at about 400 nm excitation wavelength

|  | Lead doped compound $Pb_{0.05}Sr_{3.95}Al_{14}O_{25}:Eu$ | Compound without lead $Sr_4Al_{14}O_{25}:Eu$ |
|---|---|---|
| Luminous density (%) | 101.4 | 100 |
| Wavelength (nm) | 494.5 | 493 |

TABLE 3 optical properties of some copper and/or lead doped aluminates excitable by long wave ultraviolet and/or by visible light and their luminous density in % at 400 nm excitation wavelength

| Composition | Possible excitation range(nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| $Cu_{0.5}Sr_{3.5}Al_{14}O_{25}$:Eu | 360-430 | 101.2 | 495 | 493 |
| $Cu_{0.02}Sr_{3.98}Al_{14}O_{25}$:Eu | 360-430 | 103.1 | 494 | 493 |
| $Pb_{0.05}Sr_{3.95}Al_{14}O_{25}$:Eu | 360-430 | 101.4 | 494.5 | 493 |
| $Cu_{0.01}Sr_{3.99}Al_{13.995}Si_{0.005}O_{25}$:Eu | 360-430 | 103 | 494 | 492 |
| $Cu_{0.01}Sr_{3.395}Ba_{0.595}Al_{14}O_{25}$:Eu, Dy | 360-430 | 100.8 | 494 | 493 |
| $Pb_{0.05}Sr_{3.95}Al_{13.95}Ga_{0.05}O_{25}$:Eu | 360-430 | 101.5 | 494 | 494 |

$$a(M'O).b(M''O).c(Al_2O_3).d(M'''_2O_3).e(M''''O_2).f(M''''_xO_y) \quad (5)$$

wherein M' may be Pb, Cu, and/or any combination thereof; M'' may be Be, Mg, Ca, Sr, Ba, Zn, Cd, Mn, and/or any combination thereof; M''' may be B, Ga, In, and/or any combination thereof; M'''' may be Si, Ge, Ti, Zr, Hf, and/or any combination thereof; M''''' may be Bi, Sn, Sb, Sc, Y, La, Ce, Pr, Nd, Pm, Sm, Eu, Gd, Tb, Dy, Ho, Er, Tm, Yb, Lu, and/or any combination thereof; $0<a\leq1$; $0\leq b\leq2$; $0<c\leq8$; $0\leq d\leq1$; $0\leq e\leq1$; $0<f\leq2$; $1\leq x\leq2$; and $1\leq y\leq5$.

EXAMPLE OF PREPARATION

Preparation of the Luminescent Material Having Formula (6)

$$Cu_{0.05}Sr_{0.95}Al_{1.9997}Si_{0.0003}O_4\text{:Eu} \quad (6)$$

Starting materials: CuO, $SrCO_3$, $Al_2O_3$, $SiO_2$, $Eu_2O_3$, and/or any combination thereof.

The starting materials in the form of, for example, pure oxides and/or as carbonates may be mixed in stoichiometric proportions together with small amounts of flux, for example, $AlF_3$. The mixture may be fired in an alumina crucible at about 1,250° C. in a reduced atmosphere for about 3 hours. After that the material may be milled, washed, dried and sieved. The resulting luminescent material may have an emission maximum of about 521.5 nm.

TABLE 4 copper doped $Eu^{2+}$-activated aluminate compared with $Eu^{2+}$-activated aluminate without copper at about 400 nm excitation wavelength

| | Copper doped compound $Cu_{0.05}Sr_{0.95}Al_{1.9997}Si_{0.0003}O_4$:Eu | Compound without copper $SrAl_2O_4$:Eu |
|---|---|---|
| Luminous density (%) | 106 | 100 |
| Wavelength (nm) | 521.5 | 519 |

Preparation of the Luminescent Material Having Formula (7)

$$Cu_{0.12}BaMg_{1.88}Al_{16}O_{27}\text{:Eu} \quad (7)$$

Starting materials: CuO, MgO, $BaCO_3$, $Al(OH)_3$, $Eu_2O_3$, and/or any combination thereof.

The starting materials in the form of, for example, pure oxides, hydroxides, and/or carbonates may be mixed in stoichiometric proportions together with small amounts of flux, for example, $AlF_3$. The mixture may be fired in an alumina crucible at about 1,420° C. in a reduced atmosphere for about 2 hours. After that the material may be milled, washed, dried, and sieved. The resulting luminescent material may have an emission maximum of about 452 nm.

TABLE 5 copper doped $Eu^{2+}$-activated aluminate compared with copper not doped $Eu^{2+}$-activated aluminate at 400 nm excitation wavelength

| | Copper doped compound $Cu_{0.12}BaMg_{1.88}Al_{16}O_{27}$:Eu | Comparison without copper $BaMg_2Al_{16}O_{27}$:Eu |
|---|---|---|
| Luminous density (%) | 101 | 100 |
| Wavelength (nm) | 452 | 450 |

Preparation of the Luminescent Material Having Formula (8)

$$Pb_{0.1}Sr_{0.9}Al_2O_4\text{:Eu} \quad (8)$$

Starting materials: PbO, $SrCO_3$, $Al(OH)_3$, $Eu_2O_3$, and/or any combination thereof.

The starting materials in form of, for example, pure oxides, hydroxides, and/or carbonates may be mixed in stochiometric proportions together with small amounts of flux, for example, $H_3BO_3$. The mixture may be fired in an alumina crucible at about 1,000° C. for about 2 hours in the air. After milling the pre-fired materials a second firing step at about 1,420° C. in the air for about 1 hour and in a reduced atmosphere for about 2 hours may be followed. After that the material may be milled, washed, dried and sieved. The resulting luminescent material may have an emission maximum of about 521 nm.

TABLE 6 lead doped $Eu^{2+}$-activated aluminate compared with $Eu^{2+}$-activated aluminate without lead at about 400 nm excitation wavelength

| | Lead doped compound $Pb_{0.1}Sr_{0.9}Al_2O_4$:Eu | Compound without lead $SrAl_2O_4$:Eu |
|---|---|---|
| Luminous density (%) | 102 | 100 |
| Wavelength (nm) | 521 | 519 |

Results obtained in regard to copper and/or lead doped aluminates are shown in table 7.

TABLE 7 optical properties of some copper and/or lead doped aluminates excitable by
long wave ultraviolet and/or by visible light and their luminous density in % at 400 nm
excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| $Cu_{0.05}Sr_{0.95}Al_{1.9997}Si_{0.0003}O_4$:Eu | 360-440 | 106 | 521.5 | 519 |
| $Cu_{0.2}Mg_{0.7995}Li_{0.0005}Al_{1.9}Ga_{0.1}O_4$:Eu, Dy | 360-440 | 101.2 | 482 | 480 |
| $Pb_{0.1}Sr_{0.9}Al_2O_4$:Eu | 360-440 | 102 | 521 | 519 |
| $Cu_{0.05}BaMg_{1.95}Al_{16}O_{27}$:Eu, Mn | 360-400 | 100.5 | 451, 515 | 450, 515 |
| $Cu_{0.12}BaMg_{1.88}Al_{16}O_{27}$:Eu | 360-400 | 101 | 452 | 450 |
| $Cu_{0.01}BaMg_{0.99}Al_{10}O_{17}$:Eu | 360-400 | 102.5 | 451 | 449 |
| $Pb_{0.1}BaMg_{0.9}Al_{9.5}Ga_{0.5}O_{17}$:Eu, Dy | 360-400 | 100.8 | 448 | 450 |
| $Pb_{0.08}Sr_{0.902}Al_2O_4$:Eu, Dy | 360-440 | 102.4 | 521 | 519 |
| $Pb_{0.2}Sr_{0.8}Al_2O_4$:Mn | 360-440 | 100.8 | 658 | 655 |
| $Cu_{0.06}Sr_{0.94}Al_2O_4$:Eu | 360-440 | 102.3 | 521 | 519 |
| $Cu_{0.05}Ba_{0.94}Pb_{0.06}Mg_{0.95}Al_{10}O_{17}$:Eu | 360-440 | 100.4 | 451 | 449 |
| $Pb_{0.3}Ba_{0.7}Cu_{0.1}Mg_{1.9}Al_{16}O_{27}$:Eu | 360-400 | 100.8 | 452 | 450 |
| $Pb_{0.3}Ba_{0.7}Cu_{0.1}Mg_{1.9}Al_{16}O_{27}$:Eu, Mn | 360-400 | 100.4 | 452, 515 | 450, 515 |

Lead and/or copper doped silicates having formula (9)

$$a(M'O).b(M''O).c(M'''X).d(M'''_2O).e(M''''_2O_3).\\f(M'''''_oO_p).g(SiO_2).h(M''''''_xO_y) \quad (9)$$

wherein M' may be Pb, Cu, and/or any combination thereof; M'' may be Be, Mg, Ca, Sr, Ba, Zn, Cd, Mn, and/or any combination thereof; M''' may be Li, Na, K, Rb, Cs, Au, Ag, and/or any combination thereof; M'''' may be Al, Ga, In, and/or any combination thereof; M''''' may be Ge, V, Nb, Ta, W, Mo, Ti, Zr, Hf, and/or any combination thereof; M'''''' may be Bi, Sn, Sb, Sc, Y, La, Ce, Pr, Nd, Pm, Sm, Eu, Gd, Tb, Dy, Ho, Er, Tm, Yb, Lu, and/or any combination thereof; X may be F; Cl, Br, I, and any combination thereof; $0<a\leq$; $0<b\leq 8$; $0\leq c\leq 4$; $0\leq d\leq 2$; $0\leq e\leq 2$; $0\leq f\leq 2$; $0<g\leq 10$; $0<h\leq 5$; $1\leq o\leq 2$; $1\leq p\leq 5$; $1\leq x\leq 2$; and $1\leq y\leq 5$.

EXAMPLE OF PREPARATION

Preparation of the Luminescent Material Having Formula (10)

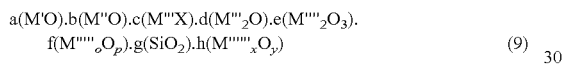

$$Cu_{0.05}Sr_{1.7}Ca_{0.25}SiO_4:Eu \quad (10)$$

Starting materials: CuO, $SrCO_3$, $CaCO_3$, $SiO_2$, $Eu_2O_3$, and/or any combination thereof.

The starting materials in the form of pure oxides and/or carbonates may be mixed in stoichiometric proportions together with small amounts of flux, for example, $NH_4Cl$. The mixture may be fired in an alumina crucible at about 1,200° C. in an inert gas atmosphere (e.g., $N_2$ or noble gas) for about 2 hours. Then the material may be milled. After that, the material may be fired in an alumina crucible at about 1,200° C. in a slightly reduced atmosphere for about 2 hours. Then, the material may be milled, washed, dried, and sieved. The resulting luminescent material may have an emission maximum at about 592 nm.

TABLE 8 copper doped $Eu^{2+}$-activated silicate
compared with $Eu^{2+}$-activated silicate
without copper at about 400 nm excitation wavelength

| | Copper doped compound $Cu_{0.05}Sr_{1.7}Ca_{0.25}SiO_4$:Eu | Compound without copper $Sr_{1.7}Ca_{0.3}SiO_4$:Eu |
|---|---|---|
| Luminous density (%) | 104 | 100 |
| Wavelength (nm) | 592 | 588 |

Preparation of the Luminescent Material Having Formula (11)

$$Cu_{0.2}Ba_2Zn_{0.2}Mg_{0.6}Si_2O_7:Eu \quad (1)$$

Starting materials: CuO, $BaCO_3$, ZnO, MgO, $SiO_2$, $Eu_2O_3$, and/or any combination thereof.

The starting materials in the form of very pure oxides and carbonates may be mixed in stoichiometric proportions together with small amounts of flux, for example, $NH_4Cl$. In a first step the mixture may be fired in an alumina crucible at about 1,100° C. in a reduced atmosphere for about 2 hours. Then the material may be milled. After that the material may be fired in an alumina crucible at about 1,235° C. in a reduced atmosphere for about 2 hours. Then that the material may be milled, washed, dried and sieved. The resulting luminescent material may have an emission maximum at about 467 nm.

TABLE 9 copper doped $Eu^{2+}$-activated silicate
compared with $Eu^{2+}$-activated silicate
without copper at 400 nm excitation wavelength

| | Copper doped compound $Cu_{0.2}Sr_2Zn_{0.2}Mg_{0.6}Si_2O_7$:Eu | Compound without copper $Sr_2Zn_2Mg_{0.6}Si_2O_7$:Eu |
|---|---|---|
| Luminous density (%) | 101.5 | 100 |
| Wavelength (nm) | 467 | 465 |

Preparation of the Luminescent Material Having Formula (12)

$$Pb_{0.1}Ba_{0.95}Sr_{0.95}Si_{0.998}Ge_{0.002}O_4:Eu \quad (12)$$

Starting materials: PbO, SrCO$_3$, BaCO$_3$, SiO$_2$, GeO$_2$, Eu$_2$O$_3$, and/or any combination thereof.

The starting materials in the form of oxides and/or carbonates may be mixed in stoichiometric proportions together with small amounts of flux, for example, NH$_4$Cl. The mixture may be fired in an alumina crucible at about 1,000° C. for about 2 hours in the air. After milling the pre-fired materials a second firing step at 1,220° C. in air for 4 hours and in reducing atmosphere for 2 hours may be followed. After that the material may be milled, washed, dried and sieved. The resulting luminescent material may have an emission maximum at about 527 nm.

TABLE 10 lead doped Eu$^{2+}$-activated silicate compared with Eu$^{2+}$-activated silicate without lead at about 400 nm excitation wavelength

|  | Lead doped compound Pb$_{0.1}$Ba$_{0.95}$Sr$_{0.95}$Si$_{0.998}$Ge$_{0.002}$O$_4$:Eu | Compound without lead BaSrSiO$_4$:Eu |
|---|---|---|
| Luminous density (%) | 101.3 | 100 |
| Wavelength (nm) | 527 | 525 |

Preparation of the Luminescent Material Having Formula (13)

$$Pb_{0.25}Sr_{3.75}Si_3O_8Cl_4:Eu \quad (13)$$

Starting materials: PbO, SrCO$_3$, SrCl$_2$, SiO$_2$, Eu$_2$O$_3$, and any combination thereof.

The starting materials in the form of oxides, chlorides, and/or carbonates may be mixed in stoichiometric proportions together with small amounts of flux, for example, NH$_4$Cl. The mixture may be fired in an alumina crucible in a first step at about 1,100° C. for about 2 hours in the air. After milling the pre-fired materials a second firing step at about 1,220° C. in the air for about 4 hours and in a reduced atmosphere for about 1 hour may be followed. After that the material may be milled, washed, dried and sieved. The resulting luminescent material may have an emission maximum at about 492 nm.

TABLE 11 lead doped Eu$^{2+}$-activated chlorosilicate compared with Eu$^{2+}$-activated chlorosilicate without lead at 400 nm excitation wavelength

|  | Lead doped compound Pb$_{0.25}$Sr$_{3.75}$Si$_3$O$_8$Cl$_4$:Eu | Compound without lead Sr$_4$Si$_3$O$_8$Cl$_4$:Eu |
|---|---|---|
| Luminous density (%) | 100.6 | 100 |
| Wavelength (nm) | 492 | 490 |

Results obtained with respect to copper and/or lead doped silicates are shown in table 12.

TABLE 12 optical properties of some copper and/or lead doped rare earth activated silicates excitable by long wave ultraviolet and/or by visible light and their luminous density in % at about 400 nm excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| Pb$_{0.1}$Ba$_{0.95}$Sr$_{0.95}$Si$_{0.998}$Ge$_{0.002}$O$_4$:Eu | 360-470 | 101.3 | 527 | 525 |
| Cu$_{0.02}$(Ba,Sr,Ca,Zn)$_{1.98}$SiO$_4$:Eu | 360-500 | 108.2 | 565 | 560 |
| Cu$_{0.05}$Sr$_{1.7}$Ca$_{0.25}$SiO$_4$:Eu | 360-470 | 104 | 592 | 588 |
| Cu$_{0.05}$Li$_{0.002}$Sr$_{1.5}$Ba$_{0.448}$SiO$_4$:Gd, Eu | 360-470 | 102.5 | 557 | 555 |
| Cu$_{0.2}$Sr$_2$Zn$_{0.2}$Mg$_{0.6}$Si$_2$O$_7$:Eu | 360-450 | 101.5 | 467 | 465 |
| Cu$_{0.02}$Ba$_{2.8}$Sr$_{0.2}$Mg$_{0.98}$Si$_2$O$_8$:Eu, Mn | 360-420 | 100.8 | 440, 660 | 438, 660 |
| Pb$_{0.25}$Sr$_{3.75}$Si$_3$O$_8$Cl$_4$:Eu | 360-470 | 100.6 | 492 | 490 |
| Cu$_{0.2}$Ba$_{2.2}$Sr$_{0.75}$Pb$_{0.05}$Zn$_{0.8}$Si$_2$O$_8$:Eu | 360-430 | 100.8 | 448 | 445 |
| Cu$_{0.2}$Ba$_3$Mg$_{0.8}$Si$_{1.99}$Ge$_{0.01}$O$_8$:Eu | 360-430 | 101 | 444 | 440 |
| Cu$_{0.5}$Zn$_{0.5}$Ba$_2$Ge$_{0.2}$Si$_{1.8}$O$_7$:Eu | 360-420 | 102.5 | 435 | 433 |
| Cu$_{0.8}$Mg$_{0.2}$Ba$_3$Si$_2$O$_8$:Eu, Mn | 360-430 | 103 | 438, 670 | 435, 670 |
| Pb$_{0.15}$Ba$_{1.84}$Zn$_{0.01}$Si$_{0.99}$Zr$_{0.01}$O$_4$:Eu | 360-500 | 101 | 512 | 510 |
| Cu$_{0.2}$Ba$_5$Ca$_{2.8}$Si$_4$O$_{16}$:Eu | 360-470 | 101.8 | 495 | 491 |

With lead and/or copper doped antimonates having formula (14)

$$a(M'O).b(M''_2O).c(M''X).d(Sb_2O_5).e(M'''O).f(M''''_xO_y) \quad (14)$$

wherein M' may be Pb, Cu, and/or any combination thereof; M" may be Li, Na, K, Rb, Cs, Au, Ag, and/or any combination thereof; M"' may be Be, Mg, Ca, Sr, Ba, Zn, Cd, Mn, and/or any combination thereof; M"" may be Bi, Sn, Sc, Y, La, Pr, Sm, Eu, Tb, Dy, Gd, and/or any combination thereof; X may be F; Cl, Br, I, and/or any combination thereof; $0<a\leq2$; $0\leq b\leq2$; $0\leq c\leq4$; $0<d\leq8$; $0-e\leq8$; $0\leq f\leq2$; $1\leq x\leq2$; and $1\leq y\leq5$.

EXAMPLES OF PREPARATION

Preparation of the Luminescent Material Having Formula (15)

$$Cu_{0.2}Mg_{1.7}Li_{0.2}Sb_2O_7\text{:Mn} \quad (15)$$

Starting materials: CuO, MgO, $Li_2O$, $Sb_2O_5$, $MnCO_3$, and/or any combination thereof.

The starting materials in the form of oxides may be mixed in stoichiometric proportion together with small amounts of flux. In a first step the mixture may be fired in an alumina crucible at about 985° C. in the air for about 2 hours. After pre-firing the material may be milled again. In a second step the mixture may be fired in an alumina crucible at about 1,200° C. in an atmosphere containing oxygen for about 8 hours. After that the material may be milled, washed, dried and sieved. The resulting luminescent material may have an emission maximum at about 626 nm.

TABLE 13 copper doped antimonate compared with antimonate without copper at about 400 nm excitation wavelength

|  | Copper doped compound $Cu_{0.2}Mg_{1.7}Li_{0.2}Sb_2O_7$:Mn | Comparison without copper $Mg_2Li_{0.2}Sb_2O_7$:Mn |
|---|---|---|
| Luminous density (%) | 101.8 | 100 |
| Wavelength (nm) | 652 | 650 |

Preparation of the Luminescent Material Having Formula (16)

$$Pb_{0.006}Ca_{0.6}Sr_{0.394}Sb_2O_6 \quad (16)$$

Starting materials: PbO, $CaCO_3$, $SrCO_3$, $Sb_2O_5$, and/or any combination thereof.

The starting materials in the form of oxides and/or carbonates may be mixed in stoichiometric proportions together with small amounts of flux. In a first step the mixture may be fired in an alumina crucible at about 975° C. in the air for about 2 hours. After pre-firing the material may be milled again. In a second step the mixture may be fired in an alumina crucible at about 1,175° C. in the air for about 4 hours and then in an oxygen-containing atmosphere for about 4 hours. After that the material may be milled, washed, dried and sieved. The resulting luminescent material may have an emission maximum at about 637 nm.

TABLE 14 lead doped antimonate compared with antimonate without lead at 400 nm excitation wavelength

|  | Lead doped compound $Pb_{0.006}Ca_{0.6}Sr_{0.394}Sb_2O_6$ | Compound without lead $Ca_{0.6}Sr_{0.4}Sb_2O_6$ |
|---|---|---|
| Luminous density (%) | 102 | 100 |
| Wavelength (nm) | 637 | 638 |

Results obtained in respect to copper and/or lead doped antimonates are shown in table 15.

TABLE 15 optical properties of some copper and/or lead doped antimonates excitable by long wave ultraviolet and/or by visible light and their luminous density in % at about 400 nm excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| $Pb_{0.2}Mg_{0.002}Ca_{1.798}Sb_2O_6F_2$:Mn | 360-400 | 102 | 645 | 649 |
| $Cu_{0.15}Ca_{1.845}Sr_{0.005}Sb_{1.998}Si_{0.002}O_7$:Mn | 360-400 | 101.5 | 660 | 658 |
| $Cu_{0.2}Mg_{1.7}Li_{0.2}Sb_2O_7$:Mn | 360-400 | 101.8 | 652 | 650 |
| $Cu_{0.2}Pb_{0.01}Ca_{0.79}Sb_{1.98}Nb_{0.02}O_6$:Mn | 360-400 | 98.5 | 658 | 658 |
| $Cu_{0.01}Ca_{1.99}Sb_{1.9995}V_{0.0005}O_7$:Mn | 360-400 | 100.5 | 660 | 657 |
| $Pb_{0.006}Ca_{0.6}Sr_{0.394}Sb_2O_6$ | 360-400 | 102 | 637 | 638 |
| $Cu_{0.02}Ca_{0.9}Sr_{0.5}Ba_{0.4}Mg_{0.18}Sb_2O_7$ | 360-400 | 102.5 | 649 | 645 |
| $Pb_{0.198}Mg_{0.004}Ca_{1.798}Sb_2O_6F_2$ | 360-400 | 101.8 | 628 | 630 |

Lead and/or copper doped germanates and/or a germanate-silicates having formula (17)

$$a(M'O).b(M''_2O).c(M''X).d(GeO_2).e(M'''O).f(M''''_2O_3).g(M'''''_oO_p).h(M''''''_xO_y) \quad (17)$$

wherein M' may be Pb, Cu, and/or any combination thereof; M'' may be Li, Na, K, Rb, Cs, Au, Ag, and/or any combination thereof; M''' may be Be, Mg, Ca, Sr, Ba, Zn, Cd, and/or any combination thereof; M'''' may be Sc, Y, B, Al, La, Ga, In, and/or any combination thereof; M''''' may be Si, Ti, Zr, Mn, V, Nb, Ta, W, Mo, and/or any combination thereof; M'''''' may be Bi, Sn, Pr, Sm, Eu, Gd, Dy, and/or any combination thereof; X may be F, Cl, Br, I, and/or any combination thereof; $0<a\leq2$; $0\leq b\leq2$; $0\leq c\leq10$; $0<d\leq10$; $0\leq e\leq14$; $0\leq f\leq14$; $0\leq g\leq10$; $0\leq h\leq2$; $1\leq o\leq2$; $1\leq p\leq5$; $1\leq x\leq2$; and $1\leq y\leq5$.

EXAMPLE OF PREPARATION

Preparation of the Luminescent Material Having Formula (18)

$$Pb_{0.004}Ca_{1.99}Zn_{0.006}Ge_{0.8}Si_{0.2}O_4:Mn \quad (18)$$

Starting materials: PbO, CaCO$_3$, ZnO, GeO$_2$, SiO$_2$, MnCO$_3$, and/or any combination thereof.

The starting materials in the form of oxides and/or carbonates may be mixed in stoichiometric proportions together with small amounts of flux, for example, NH$_4$Cl. In a first step the mixture may be fired in an alumina crucible at about 1,200° C. in an oxygen-containing atmosphere for about 2 hours. Then, the material may be milled again. In a second step the mixture may be fired in an alumina crucible at about 1,200° C. in oxygen containing atmosphere for about 2 hours. After that the material may be milled, washed, dried and sieved. The resulting luminescent material may have an emission maximum at about 655 nm.

Preparation of the Luminescent Material Having Formula (19)

$$Cu_{0.46}Sr_{0.54}Ge_{0.6}Si_{0.4}O_3:Mn \quad (19)$$

Starting materials: CuO, SrCO$_3$, GeO$_2$, SiO$_2$, MnCO$_3$, and/or any combination thereof.

The starting materials in the form of oxides and/or carbonates may be mixed in stoichiometric proportions together with small amounts of flux, for example, NH$_4$Cl. In a first step the mixture may be fired in an alumina crucible at about 1,100° C. in an oxygen-containing atmosphere for about 2 hours. Then, the material may be milled again. In a second step the mixture may be fired in an alumina crucible at about 1,180° C. in an oxygen-containing atmosphere for about 4 hours. After that the material may be milled, washed, dried and sieved. The resulting luminescent material may have an emission maximum at about 658 mm.

TABLE 17 copper doped Mn-activated germanate-silicate compared with Mn-activated germanate-silicate without copper at 400 nm excitation wavelength

|  | Copper doped compound $Cu_{0.46}Sr_{0.54}Ge_{0.6}Si_{0.4}O_3:Mn$ | Compound without copper $SrGe_{0.6}Si_{0.4}O_3:Mn$ |
| --- | --- | --- |
| Luminous density (%) | 103 | 100 |
| Wavelength (nm) | 658 | 655 |

TABLE 16 lead doped Mn-activated germanate compared with Mn-activated germanate without lead at about 400 nm excitation wavelength

|  | Copper doped compound $Pb_{0.004}Ca_{1.99}Zn_{0.006}Ge_{0.8}Si_{0.2}O_4:Mn$ | Comparison without copper $Ca_{1.99}Zn_{0.01}Ge_{0.8}Si_{0.2}O_4:Mn$ |
| --- | --- | --- |
| Luminous density (%) | 101.5 | 100 |
| Wavelength (nm) | 655 | 657 |

TABLE 18 optical properties of some copper and/or lead doped germanate-silicates excitable by long wave ultraviolet and/or by visible light and their luminous density in % at about 400 nm excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
| --- | --- | --- | --- | --- |
| $Pb_{0.004}Ca_{1.99}Zn_{0.006}Ge_{0.8}Si_{0.2}O_4:Mn$ | 360-400 | 101.5 | 655 | 657 |
| $Pb_{0.002}Sr_{0.954}Ca_{1.044}Ge_{0.93}Si_{0.07}O_4:Mn$ | 360-400 | 101.5 | 660 | 661 |
| $Cu_{0.46}Sr_{0.54}Ge_{0.6}Si_{0.4}O_3:Mn$ | 360-400 | 103 | 658 | 655 |

TABLE 18-continued optical properties of some copper and/or lead doped germanate-silicates excitable by long wave ultraviolet and/or by visible light and their luminous density in % at about 400 nm excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| $Cu_{0.002}Sr_{0.998}Ba_{0.99}Ca_{0.01}Si_{0.98}Ge_{0.02}O_4:Eu$ | 360-470 | 102 | 538 | 533 |
| $Cu_{1.45}Mg_{26.55}Ge_{9.4}Si_{0.6}O_{48}:Mn$ | 360-400 | 102 | 660 | 657 |
| $Cu_{1.2}Mg_{26.8}Ge_{8.9}Si_{1.1}O_{48}:Mn$ | 360-400 | 103.8 | 670 | 656 |
| $Cu_4Mg_{20}Zn_4Ge_5Si_{2.5}O_{38}F_{10}:Mn$ | 360-400 | 101.5 | 658 | 655 |
| $Pb_{0.001}Ba_{0.849}Zn_{0.05}Sr_{1.1}Ge_{0.04}Si_{0.96}O_4:Eu$ | 360-470 | 101.8 | 550 | 545 |
| $Cu_{0.05}Mg_{4.95}GeO_6F_2:Mn$ | 360-400 | 100.5 | 655 | 653 |
| $Cu_{0.05}Mg_{3.95}GeO_{5.5}F:Mn$ | 360-400 | 100.8 | 657 | 653 |

Lead and/or copper doped phosphates having formula (20)

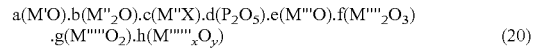
$$a(M'O).b(M''_2O).c(M''X).d(P_2O_5).e(M'''O).f(M''''_2O_3) \\ .g(M''''''O_2).h(M''''''_xO_y) \quad (20)$$

wherein M' may be Pb, Cu, and/or any combination thereof; M'' may be Li, Na, K, Rb, Cs, Au, Ag, and/or any combination thereof; M''' may be Be, Mg, Ca, Sr, Ba, Zn, Cd, Mn, and/or any combination thereof; M'''' may be Sc, Y, B, Al, La, Ga, In, and/or any combination thereof; M''''' may be Si, Ge, Ti, Zr, Hf. V, Nb, Ta, W, Mo, and/or any combination thereof; M'''''' may be Bi, Sn, Pr, Sm, Eu, Gd, Dy, Ce, Tb, and/or any combination thereof; X may be F, Cl, Br, I, and/or any combination thereof; $0<a\leq 2$; $0\leq b\leq 12$; $0\leq c\leq 16$; $0<d\leq 3$; $0\leq e\leq 5$; $0\leq f\leq 3$; $0\leq g\leq 2$; $0<h\leq 2$; $1\leq x\leq 2$; and $1\leq y\leq 5$.

EXAMPLES OF PREPARATION

Preparation of the Luminescent Material Having Formula (21)

$$Cu_{0.02}Ca_{4.98}(PO_4)_3Cl:Eu \quad (21)$$

Starting materials: CuO, CaCO$_3$, Ca$_3$(PO$_4$)$_2$, CaCl$_2$, Eu$_2$O$_3$, and/or any combination thereof.

The starting materials in the form of oxides, phosphates, and/or carbonates and chlorides may be mixed in stoichiometric proportions together with small amounts of flux. The mixture may be fired in an alumina crucible at about 1,240° C.

in reducing atmosphere for about 2 hours. After that the material may be milled, washed, dried and sieved. The luminescent material may have an emission maximum at about 450 nm.

TABLE 19 copper doped Eu$^{2+}$-activated chlorophosphate compared with Eu$^{2+}$-activated chlorophosphate without copper at about 400 nm excitation wavelength

|  | Copper doped compound $Cu_{0.02}Ca_{4.98}(PO_4)_3Cl:Eu$ | Compound without copper $Ca_5(PO_4)_3Cl:Eu$ |
|---|---|---|
| Luminous density (%) | 101.5 | 100 |
| Wavelength (nm) | 450 | 447 |

TABLE 20 copper and/or lead doped phosphates excitable by long wave ultraviolet and/or by visible light and their luminous density in % at about 400 nm excitation wavelength

| Composition | Possible excitation range (nm) | Luminous density at 400 nm excitation compared with copper/lead not doped compounds (%) | Peak wave length of lead/copper doped materials (nm) | Peak wave length of materials without lead/copper (nm) |
|---|---|---|---|---|
| $Cu_{0.02}Sr_{4.98}(PO_4)_3Cl:Eu$ | 360-410 | 101.5 | 450 | 447 |
| $Cu_{0.2}Mg_{0.8}BaP_2O_7:Eu, Mn$ | 360-400 | 102 | 638 | 635 |
| $Pb_{0.5}Sr_{1.5}P_{1.84}B_{0.16}O_{6.84}:Eu$ | 360-400 | 102 | 425 | 420 |
| $Cu_{0.5}Mg_{0.5}Ba_2(P,Si)_2O_8:Eu$ | 360-400 | 101 | 573 | 570 |
| $Cu_{0.5}Sr_{9.5}(P,B)_6O_{24}Cl_2:Eu$ | 360-400 | 102 | 460 | 456 |
| $Cu_{0.5}Ba_3Sr_{6.5}P_6O_{24}(F,Cl)_2:Eu$ | 360-410 | 102 | 443 | 442 |
| $Cu_{0.05}(Ca,Sr,Ba)_{4.95}P_3O_{12}Cl:Eu, Mn$ | 360-410 | 101.5 | 438, 641 | 435, 640 |
| $Pb_{0.1}Ba_{2.9}P_2O_8:Eu$ | 360-400 | 103 | 421 | 419 |

Meanwhile, the phosphor of the light emitting device consistent with this invention can comprise aluminate, silicate, antimonate, germanate, phosphate type chemical compound, and any combination thereof.

Figure 6:
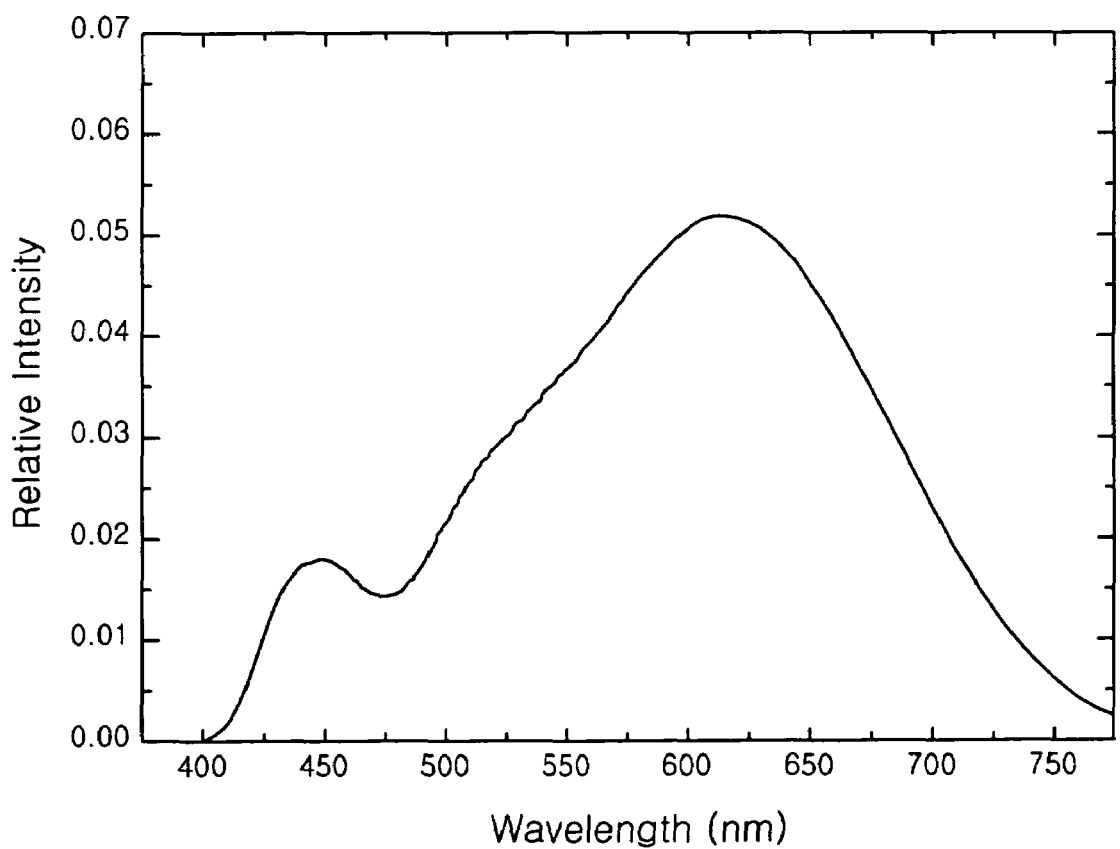
FIG. 6 shows emitting spectrum of a light emitting device with luminescent material consistent with this invention.

FIG. 6 is a one of the embodiment's emission spectrum according to the invention, which the phosphor is used for the light emitting device. The embodiment may have a light emitting diode with 405 nm wavelength and the phosphor, which is mixture of the selected multiple chemical compounds in proper ratio. The phosphor may be composed of $Cu_{0.05}BaMg_{1.95}Al_{16}O_{27}$:Eu which may have peak wavelength at about 451 nm, $Cu_{0.03}Sr_{1.5}Ca_{0.47}SiO_4$:Eu which may have peak wavelength at 586 nm, $Pb_{0.006}Ca_{0.6}Sr_{0.394}Sb_2O_6$:$Mn^{4+}$ which may have peak wavelength at about 637 nm, $Pb_{0.15}Ba_{1.84}Zn_{0.01}Si_{0.99}Zr_{0.01}O_4$:Eu which may have peak wavelength at around 512 nm, and $Cu_{0.2}Sr_{3.8}Al_{14}O_{25}$:Eu which may have peak wavelength at about 494 nm.

In such an embodiment, part of the initial about 405 nm wavelength emission light from the light emitting diode is absorbed by the phosphor, and it is converted to longer $2^{nd}$ wavelength. The $1^{st}$ and $2^{nd}$ light is mixed together and the desire emission is produced. As the shown FIG. 6, the light emitting device convert the $1^{st}$ UV light of 405 nm wavelength to wide spectral range of visible light, that is, white light, and at this time the color temperature is about 3,000K and CRI is about 90 to about 95.

Figure 7:
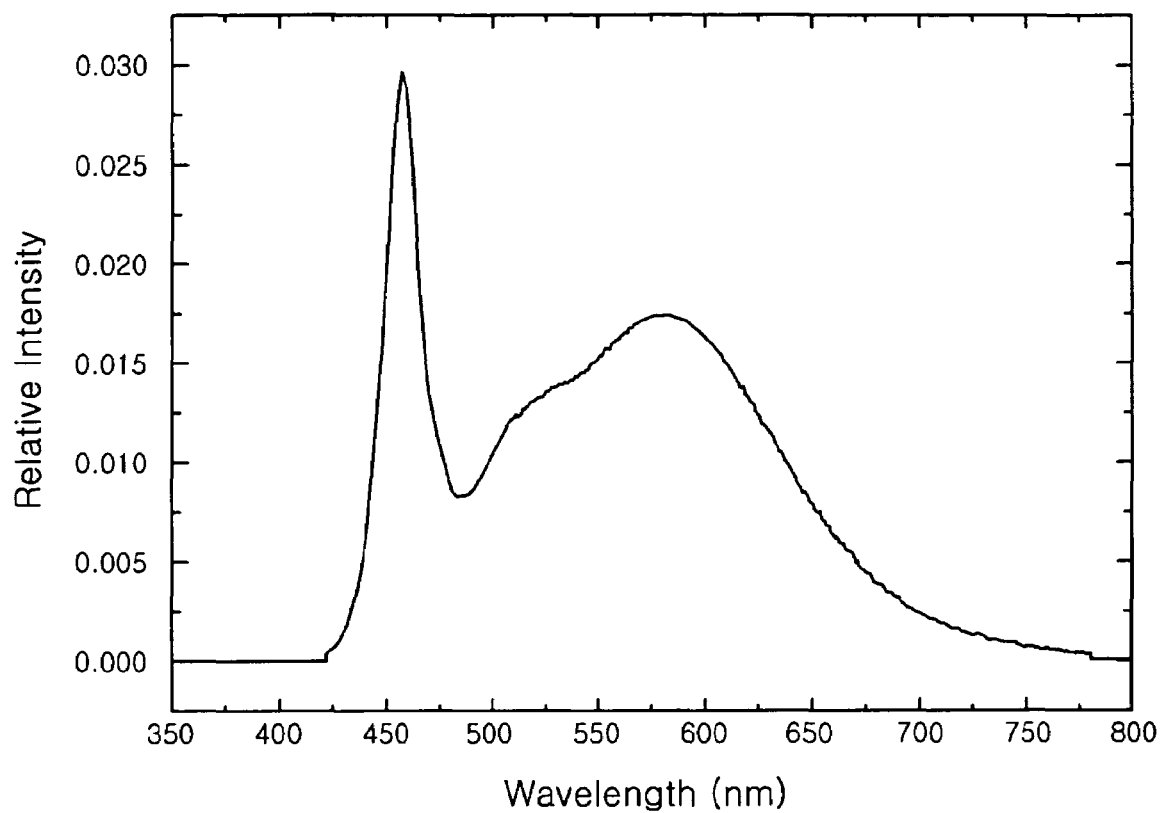
FIG. 7 shows emitting spectrum of the light emitting device with luminescent material according to another embodiment of the invention.

FIG. 7 is another embodiment's emission spectrum according to the invention, which the phosphor is applied for the light emitting device. The embodiment may have a light emitting diode with about 455 nm wavelength and the phosphor, which is mixture of the selected multiple chemical compounds in proper ratio.

The phosphor is composed of $Cu_{0.05}Sr_{1.7}Ca_{0.25}SiO_4$:Eu which may have peak wavelength at about 592 nm, $Pb_{0.1}Ba_{0.95}Sr_{0.95}Si_{0.998}Ge_{0.002}O_4$:Eu which may have peak wavelength at about 527 nm, and $Cu_{0.05}Li_{0.002}Sr_{1.5}Ba_{0.448}SiO_4$:Gd, Eu which may have peak wavelength at about 557 nm.

In such an embodiment, part of the initial about 455 nm wavelength emission light from the light emitting diode is absorbed by the phosphor, and it is converted to longer $2^{nd}$ wavelength. The $1^{st}$ and $2^{nd}$ light is mixed together and the desire emission is produced. As the shown FIG. 7, the light emitting device convert the $1^{st}$ blue light of about 455 nm wavelength to wide spectral range of visible light, that is, white light, and at this time the color temperature is about 4,000K to about 6,500K and CRI is about 86 to about 93.

The phosphor of the light emitting device according to the invention can be applied by single chemical compound or mixture of plurality of single chemical compound besides the embodiments in relation to FIG. 6 and FIG. 7, which are explained above.

According to the description above, light emitting device with wide range of color temperature about 2,000K or about 8,000K or about 10,000K and superior color rendering index more than about 90 can be realized by using the lead and/or copper doped chemical compounds containing rare earth elements.

In such a wavelength conversion light emitting device is capable of applying on mobile phone, note book and electronic devices such as home appliance, stereo, telecommunication products, but also for custom display's key pad and back light application. Moreover, it can be applied for automobile, medical instrument and illumination products.

According to the invention, it is also able to provide a wavelength conversion light emitting device with stability against water, humidity, vapor as well as other polar solvents.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

What is claimed is:

1. A light emitting device, comprising:
a light emitting diode configured to emit light; and
a phosphor configured to change a wavelength of the light, the phosphor substantially covering at least a portion of the light emitting diode;
wherein said phosphor comprises a compound including a host material, wherein divalent copper ions and oxygen are components of the host material,
wherein the compound has the formula

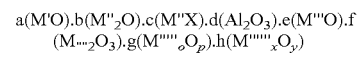

$$a(M'O).b(M''_2O).c(M''X).d(Al_2O_3).e(M'''O).f(M''''_2O_3).g(M'''''_oO_p).h(M''''''_xO_y)$$

wherein
M' is Cu, or a combination of Cu and Pb;
M'' is Li, Na, K, Rb, Cs, Au, Ag or any combination thereof;
M''' is Be, Mg, Ca, Sr, Ba, Zn, Cd, Mn or any combination thereof;
M'''' is Sc, B, Ga, In, or any combination thereof;
M''''' is Si, Ge, Ti, Zr, Mn, V, Nb, Ta, W, Mo, or any combination thereof;
M'''''' is Bi, Sn, Sb, Sc, Y, La, Ce, Pr, Nd, Pm, Sm, Eu, Gd, Tb, Dy, Ho, Er, Tm, Yb, Lu, or any combination thereof;
X is F, Cl, Br, I, or any combination thereof;
$0 < a \leq 2$;
$0 \leq b \leq 2$;
$0 \leq c \leq 2$;
$0 < d \leq 8$;
$0 < e \leq 4$;
$0 \leq f \leq 3$;
$0 \leq g \leq 8$;
$0 < h \leq 2$;
$1 \leq o \leq 2$;
$1 \leq p \leq 5$;
$1 \leq x \leq 2$; and
$1 \leq y \leq 5$.

2. The light emitting device according to claim 1, wherein the phosphor includes one or more single compounds or any combination thereof.

3. The light emitting device according to claim 1, further comprising a sealing material configured to cover the light emitting diode and the phosphor.

4. The light emitting device according to claim 3, wherein the phosphor is distributed in the sealing material.

5. The light emitting device according to claim 1, wherein the phosphor is mixed with a hardening material.

6. The light emitting device according to claim 1, wherein the light emitting diode comprises a plurality of light emitting diodes.

7. The light emitting device according to claim 1, wherein the phosphor further comprises an aluminate containing copper, an antimonate containing copper, a germanate containing copper, a germanate-silicate containing copper, a phosphate containing copper, or any combination thereof.

8. The light emitting device according to claim 1, further comprising:
a substrate;
a plurality of electrodes provided on the substrate; and
an electrically conductive device configured to connect the light emitting diode with one of the plurality of electrodes;

wherein the light emitting diode is provided on another of the plurality of electrodes.

9. The light emitting device according to claim 8, further comprising electrically conductive paste provided between the light emitting diode and one of the plurality of electrodes.

10. The light emitting device according to claim 8, further comprising a reflector configured to reflect the light from the light emitting diode.

11. The light emitting device according to claim 1, further comprising:
a plurality of leads;
a diode holder provided at the end of one of the plurality of leads; and
an electrically conductive device configured to connect the light emitting diode with another of the plurality of leads,
wherein the light emitting diode is provided in the diode holder and includes a plurality of electrodes.

12. The light emitting device according to claim 11, further comprising electrically conductive paste provided between the light emitting diode and one of the plurality of electrodes.

13. The light emitting device according to claim 1, further comprising:
a housing;
a heat sink at least partially provided in the housing;
a plurality of lead frames provided on or around the heat sink; and
an electrically conductive device configured to connect the light emitting diode with one of the plurality of lead frames,
wherein the light emitting diode is disposed over the heat sink.

14. The light emitting device according to claim 13, further comprising electrically conductive paste provided between the light emitting diode and the heat sink.

15. The light emitting device according to claim 13, wherein at least one of the plurality of lead frames protrudes from the housing.

16. The light emitting device according to claim 13, wherein the heat sink comprises a plurality of heat sinks.

17. The light emitting device according to claim 1, wherein lead is a component of the host material.

18. A light emitting device, comprising:
a light emitting diode configured to emit light; and
a phosphor configured to change a wavelength of the light, the phosphor substantially covering at least a portion of the light emitting diode:
wherein said phosphor comprises a compound including a host material, wherein divalent copper ions and oxygen are components of the host material,
wherein the compound has the formula $$a(M'O) \cdot b(M''_2O) \cdot c(M''X) \cdot 4\text{-}a\text{-}b\text{-}c(M'''O) \cdot 7(Al_2O_3) \cdot d(B_2O_3) \cdot e(Ga_2O_3) \cdot f(SiO_2) \cdot g(GeO_2) \cdot h\,(M''''_xO_y)$$

wherein
M' is Cu, or a combination of Cu and Pb;
M'' is Li, Na, K, Rb, Cs, Au, Ag, or any combination thereof;
M''' is Be, Mg, Ca, Sr, Ba, Zn, Cd, Mn, or any combination thereof;
M'''' is Bi, Sn, Sb, Sc, Y, La, In, Ce, Pr, Nd, Pm, Sm, Eu, Gd, Tb, Dy, Ho, Er, Tm, Yb, Lu, or any combination thereof;
X is F, Cl, Br, I, or any combination thereof;
$0 < a \leq 4$;
$0 \leq b \leq 2$;
$0 \leq c \leq 2$;
$0 \leq d \leq 1$;
$0 \leq e \leq 1$;
$0 \leq f \leq 1$;
$0 \leq g \leq 1$;
$0 < h \leq 2$;
$1 \leq x \leq 2$; and
$1 \leq y \leq 5$.

* * * * *

UNITED STATES PATENT AND TRADEMARK OFFICE
CERTIFICATE OF CORRECTION

PATENT NO. : 7,554,129 B2 Page 1 of 2
APPLICATION NO. : 11/024702
DATED : June 30, 2009
INVENTOR(S) : Gundula Roth et al.

It is certified that error appears in the above-identified patent and that said Letters Patent is hereby corrected as shown below:

Column 20, lines 16 to 17, the formula reading
"$a(M'O).b(M''_2O).c(M''X).d(Al_2O_3).e(M'''O).f(M''''_2O_3).g(M'''''_oO_p).h(M'''''_xO_y)$" should read
-- $a(M'O) \cdot b(M''O) \cdot c(M''X) \cdot d(M'''_2O) \cdot e(M''''_2O_3) \cdot f(M'''''_oO_p) \cdot g(SiO_2) \cdot h(M'''''_xO_y)$ --.

Column 20, lines 21 to 26, the text reading
"M" is Li, Na, K, Rb, Cs, Au, Ag or any combination thereof;
M''' is Be, Mg, Ca, Sr, Ba, Zn, Cd, Mn or any combination thereof;
M'''' is Sc, B, Ga, In, or any combination thereof;
M''''' is Si, Ge, Ti, Zr, Mn, V, Nb, Ta, W, Mo, or any combination thereof;" should read
-- M" is Be, Mg, Ca, Sr, Ba, Zn, Cd, Mn, or any combination thereof;
M''' is Li, Na, K, Rb, Cs, Au, Ag, or any combination thereof;
M'''' is Al, Ga, In, or any combination thereof;
M''''' is Ge, V, Nb, Ta, W, Mo, Ti, Zr, Hf, or any combination thereof; --.

Column 20, lines 31 to 37, the text reading
"$0 \leq b \leq 2$;
$0 \leq c \leq 2$;
$0 < d \leq 8$;
$0 < e \leq 4$;
$0 \leq f \leq 3$;
$0 \leq g \leq 8$;
$0 < h \leq 2$;" should read
-- $0 < b \leq 8$;
$0 \leq c \leq 4$;
$0 \leq d \leq 2$;
$0 \leq e \leq 2$;
$0 \leq f \leq 2$;
$0 < g \leq 10$;
$0 < h \leq 5$; --.

Column 22, lines 15 to 16, the formula reading
"$a(M'O) \cdot b(M''_2O) \cdot c(M''X) \cdot 4-a-b-c(M'''O) \cdot 7(Al_2O_3) \cdot d(B_2O_3) \cdot e(Ga_2O_3) \cdot f(SiO_2) \cdot g(GeO_2) \cdot h(M''''_xO_y)$" should read -- $a(M'O) \cdot b(M''_2O) \cdot c(M''X) \cdot d(Sb_2O_5) \cdot e(M'''O) \cdot f(M''''_xO_y)$ --.

Column 22, lines 23 to 24, the text reading
"M'''' is Bi, Sn, Sb, Sc, Y, La, In, Ce, Pr, Nd, Pm, Sm, Eu, Gd, Tb, Dy, Ho, Er, Tm, Yb, Lu, or any combination thereof;" should read
-- M'''' is Bi, Sn, Sc, Y, La, Pr, Sm, Eu, Tb, Dy, Gd, or any combination thereof; --.

UNITED STATES PATENT AND TRADEMARK OFFICE
CERTIFICATE OF CORRECTION

PATENT NO. : 7,554,129 B2 Page 2 of 2
APPLICATION NO. : 11/024702
DATED : June 30, 2009
INVENTOR(S) : Gundula Roth et al.

It is certified that error appears in the above-identified patent and that said Letters Patent is hereby corrected as shown below:

Column 22, lines 26-33, the text reading
"$0 < a \leq 4$;
$0 \leq b \leq 2$;
$0 \leq c \leq 2$;
$0 \leq d \leq 1$;
$0 \leq e \leq 1$;
$0 \leq f \leq 1$;
$0 \leq g \leq 1$;
$0 < h \leq 2$;" should read
-- $0 < a \leq 2$;
$0 \leq b \leq 2$;
$0 \leq c \leq 4$;
$0 < d \leq 8$;
$0 \leq e \leq 8$;
$0 \leq f \leq 2$; --.

Signed and Sealed this

Twenty-second Day of September, 2009

David J. Kappos
*Director of the United States Patent and Trademark Office*